US012570089B2

(12) United States Patent
Kurashima et al.

(10) Patent No.: US 12,570,089 B2
(45) Date of Patent: Mar. 10, 2026

(54) PIEZOELECTRIC ELEMENT, LIQUID EJECTION HEAD, AND LIQUID EJECTION APPARATUS

(71) Applicant: CANON KABUSHIKI KAISHA, Tokyo (JP)

(72) Inventors: Rei Kurashima, Kanagawa (JP); Shogo Tazawa, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 160 days.

(21) Appl. No.: 18/530,010

(22) Filed: Dec. 5, 2023

(65) Prior Publication Data

US 2024/0198668 A1 Jun. 20, 2024

(30) Foreign Application Priority Data

Dec. 14, 2022 (JP) ................................. 2022-199691

(51) Int. Cl.
| | |
|---|---|
| *B41J 2/14* | (2006.01) |
| *H10N 30/06* | (2023.01) |
| *H10N 30/082* | (2023.01) |
| *H10N 30/20* | (2023.01) |
| *H10N 30/87* | (2023.01) |

(52) U.S. Cl.
CPC .......... *B41J 2/14201* (2013.01); *H10N 30/06* (2023.02); *H10N 30/082* (2023.02); *H10N 30/2047* (2023.02); *H10N 30/875* (2023.02)

(58) Field of Classification Search
CPC .......... B41J 2/14201; B41J 2002/14491; B41J 2/14233; B41J 2/04501; H10N 30/06; H10N 30/082; H10N 30/2047; H10N 30/875; H10N 30/87
See application file for complete search history.

(56) References Cited

U.S. PATENT DOCUMENTS

2021/0031515 A1* 2/2021 Hirai ..................... B41J 2/14233

FOREIGN PATENT DOCUMENTS

JP 2021-024142 A 2/2021

* cited by examiner

*Primary Examiner* — Lisa Solomon
(74) *Attorney, Agent, or Firm* — Canon U.S.A., Inc. IP Division

(57) ABSTRACT

A piezoelectric element includes a first electrode provided on a substrate, a piezoelectric layer provided stacked on the first electrode, a second electrode provided stacked on the piezoelectric layer, an insulation layer, and a first wiring electrode. The insulation layer is provided in such a manner as to cover at least portions of the piezoelectric layer and the second electrode. The first wiring electrode is provided in such a manner as to cover at least a portion of the insulation layer and is electrically connected to the second electrode via a first contact hole. In plan view of the piezoelectric layer, a periphery of the first electrode and a periphery of the piezoelectric layer overlap in a region where the piezoelectric layer and the first wiring electrode overlap, and at least a portion of a periphery of the second electrode is positioned in a region of the piezoelectric layer.

8 Claims, 9 Drawing Sheets

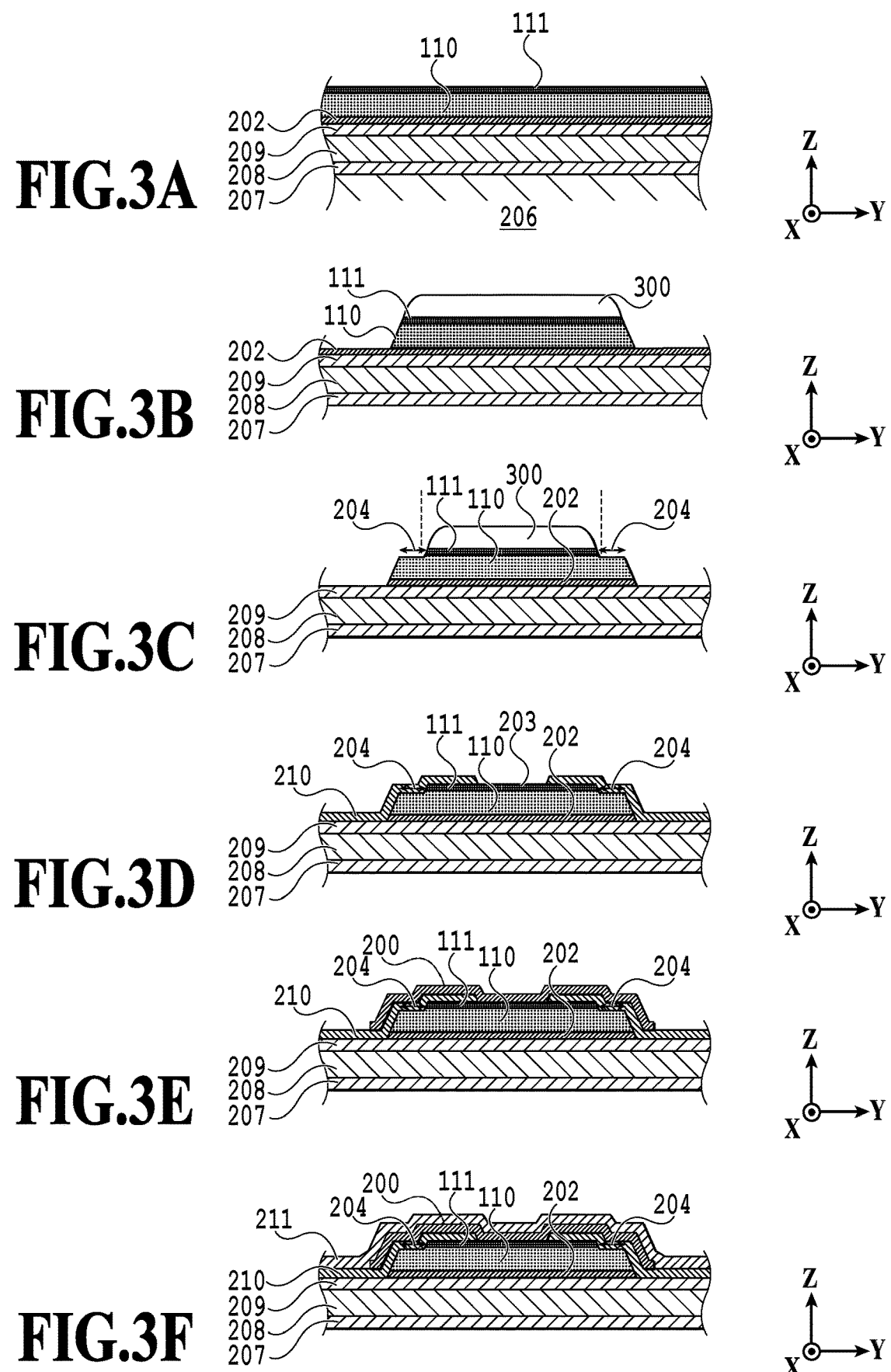

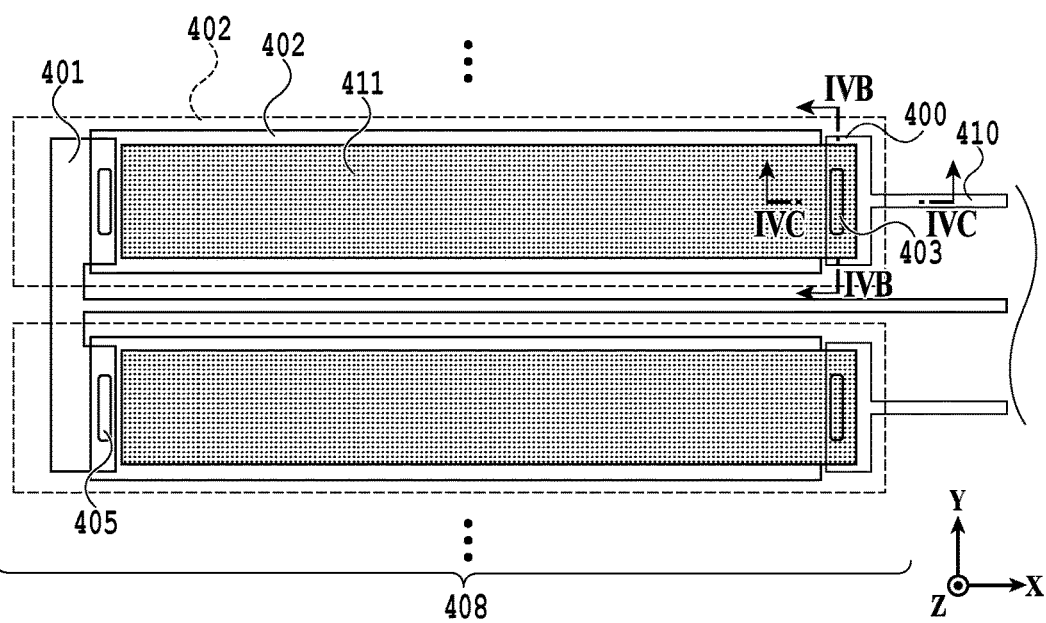
FIG.4A
Related Art
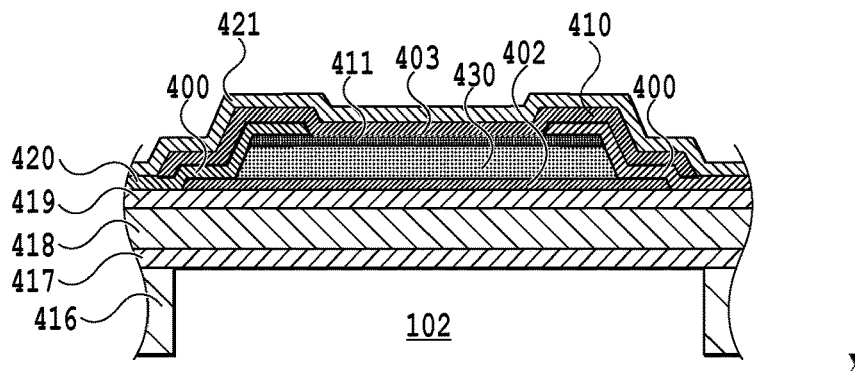
FIG.4B
Related Art
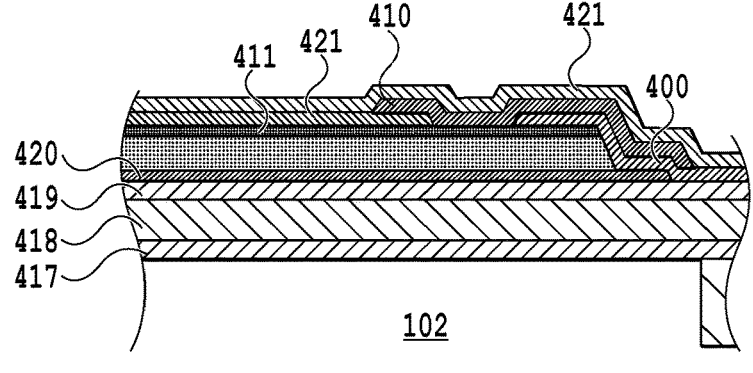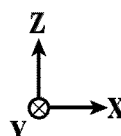
FIG.4C
Related Art

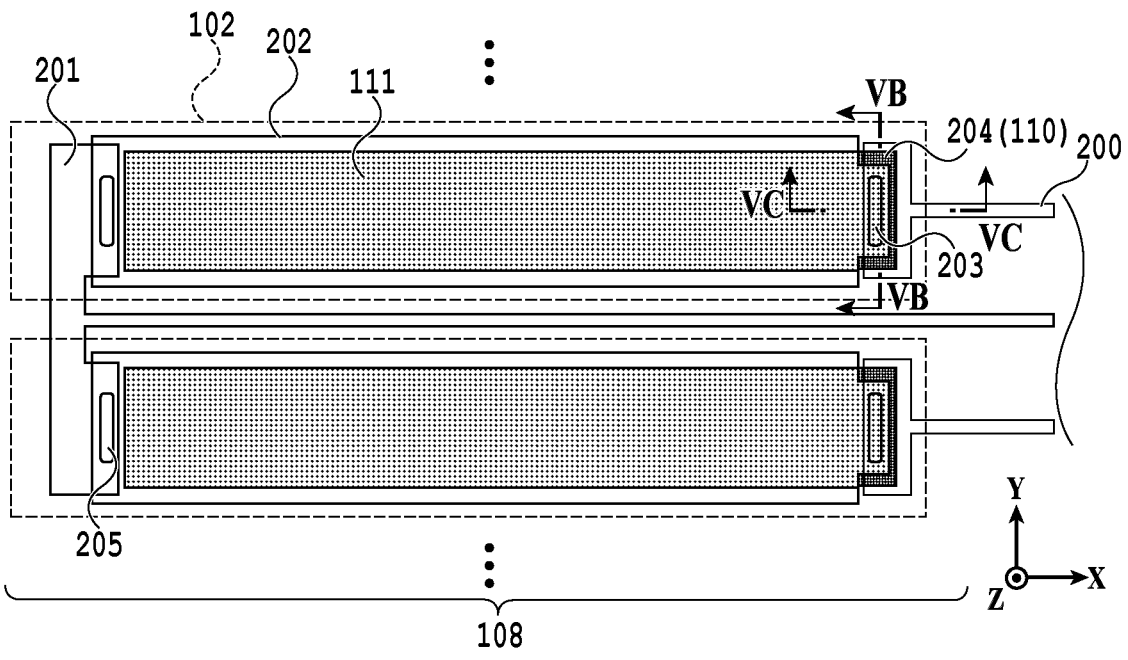
FIG.6A
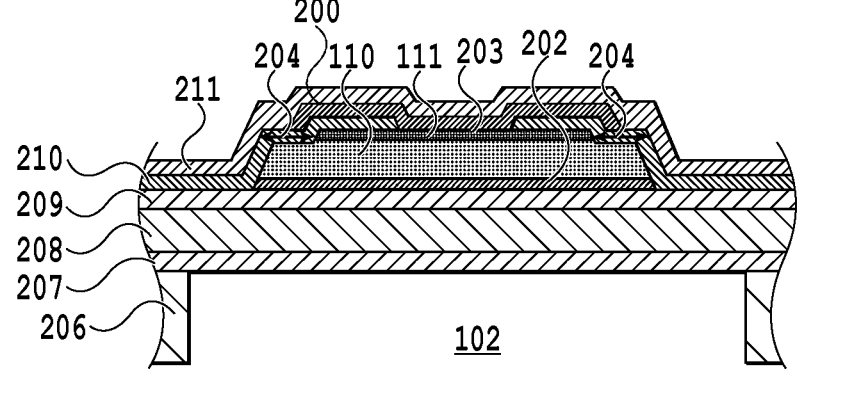
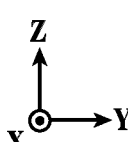
FIG.6B

PIEZOELECTRIC ELEMENT, LIQUID EJECTION HEAD, AND LIQUID EJECTION APPARATUS

BACKGROUND

Field of the Disclosure

The present disclosure relates to a piezoelectric element, a liquid ejection head, and a liquid ejection apparatus.

Description of the Related Art

Japanese Patent Laid-Open No. 2021-024142 discloses a liquid ejection head that includes a thin-film piezoelectric element. Here, let a first electrode be an electrode located on a vibration plate side of the piezoelectric element and a second electrode be an electrode located on an opposite side of the vibration plate across the piezoelectric element. In a configuration disclosed in Japanese Patent Laid-Open No. 2021-024142, a wiring line that leads to the first electrode (a lower electrode) of the piezoelectric element and the second electrode (an upper electrode) of the piezoelectric element are present overlapping via an insulation film in a thickness direction of the piezoelectric element. The region of the overlap is formed within a region where the piezoelectric element deforms.

In a piezoelectric element that repeatedly deforms, an insulation film also deforms by the repetitive deformation. Therefore, deterioration of the insulation film is likely to proceed. If deterioration of the insulation film occurs in a region where the wiring line and the electrode overlap via the insulation film in the thickness direction of the piezoelectric element, electrochemical reaction, leakage, or the like may occur, resulting in occurrence of a trouble of an apparatus. It is conceivable to make the insulation film thick for improvement in durability and long-term reliability. However, in this case, a deformation amount of the piezoelectric element is reduced.

SUMMARY

Therefore, the present disclosure provides a piezoelectric element, a liquid ejection head, and a liquid ejection apparatus of which a long-term reliability can be improved.

According to an aspect of the present disclosure, a piezoelectric element includes a first electrode provided on a substrate, a piezoelectric layer provided stacked on the first electrode, a second electrode provided stacked on the piezoelectric layer, an insulation layer provided in such a manner as to cover at least portions of the piezoelectric layer and the second electrode, and a first wiring electrode provided in such a manner as to cover at least a portion of the insulation layer and is electrically connected to the second electrode via a first contact hole, wherein, in plan view of the piezoelectric layer, a periphery of the first electrode and a periphery of the piezoelectric layer overlap in a region where the piezoelectric layer and the first wiring electrode overlap, and at least a portion of a periphery of the second electrode is positioned in a region of the piezoelectric layer.

According to the present disclosure, it is possible to provide a piezoelectric element, a liquid ejection head, and a liquid ejection apparatus of which a long-term reliability can be improved.

Further features of the present disclosure will become apparent from the following description of exemplary embodiments with reference to the attached drawings.

BRIEF DESCRIPTION OF THE DRAWINGS

FIG. 3A is a diagram illustrating a manufacturing process of the piezoelectric element in a sequential order of steps;

FIG. 3B is a diagram illustrating the manufacturing process of the piezoelectric element in the sequential order of steps;

FIG. 3C is a diagram illustrating the manufacturing process of the piezoelectric element in the sequential order of steps;

FIG. 3D is a diagram illustrating the manufacturing process of the piezoelectric element in the sequential order of steps;

FIG. 3E is a diagram illustrating the manufacturing process of the piezoelectric element in the sequential order of steps;

FIG. 3F is a diagram illustrating the manufacturing process of the piezoelectric element in the sequential order of steps;

FIG. 4A is a plan view of a typical piezoelectric element;

FIG. 4B is a diagram illustrating the typical piezoelectric element;

FIG. 4C is a diagram illustrating the typical piezoelectric element;

FIG. 6A is a plan view of a piezoelectric element;

FIG. 6B is a diagram illustrating the piezoelectric element;

DESCRIPTION OF THE EMBODIMENTS

First Embodiment

A first embodiment of the present disclosure will be described below with reference to the drawings.

Figure 1A:
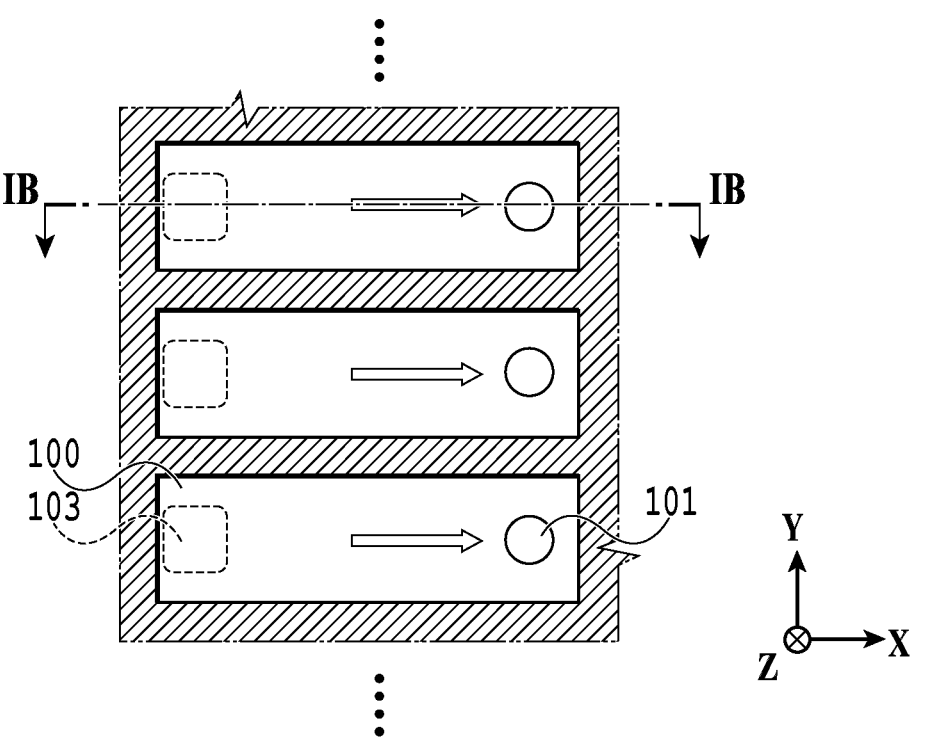
FIG. 1A is a diagram illustrating a flow path configuration in an element substrate of a liquid ejection head.
Figure 1B:
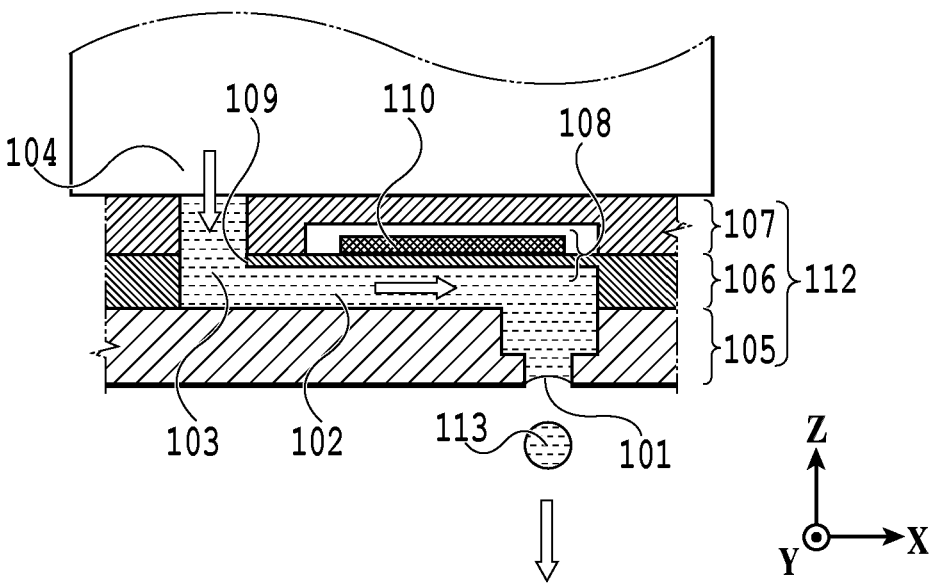
FIG. 1B is a diagram illustrating the flow path configuration in the element substrate of the liquid ejection head.

FIG. 1A and FIG. 1B are diagrams illustrating a flow path configuration in an element substrate 112 of a liquid ejection head in the present embodiment that is not illustrated. FIG. 1A is a top view as viewed on an ejection port 101 side, and FIG. 1B is a cross-sectional view taken along the line Ib-Ib in FIG. 1A. The element substrate 112 includes three types of substrates (a first flow path substrate 105, a second flow path substrate 106, and a third flow path substrate 107). The substrates are combined together to form a flow path. As illustrated in FIG. 1A, flow path blocks 100 include ejection ports 101 arrayed along a Y direction, and pressure chambers 102 and ink supply paths 103 that are provided in such a manner as to communicate with the respective ejection ports 101. The ink supply paths 103 connected to a common liquid chamber 104 each supply ink to the respective pressure chambers 102. Arrows in the figures indicate flows of liquid (will be also referred to as ink).

As illustrated in FIG. 1B, the element substrate 112 in the present embodiment is formed by stacking the first flow path substrate 105 including the ejection ports 101, and the second flow path substrate 106 and the third flow path substrate 107 that form piezoelectric elements and pressure chambers in a Z direction. The third flow path substrate 107 is a substrate that isolates piezoelectric layers 110, which are parts of piezoelectric elements 108 from ink and is a substrate that includes flow paths for supplying ink from the common liquid chamber 104 to the pressure chambers 102.

The ink supply paths 103, the pressure chambers 102, and the ejection ports 101 are formed for the respective individual piezoelectric elements 108. The pressure chambers 102 adjacent to each other are partitioned with partitions, with which the pressure chambers 102 are unsusceptible to a direct effect of pressure by adjacent piezoelectric elements 108. Here, the piezoelectric elements 108 are formed to be adjacent to vibration plates 109.

Ink contained in the pressure chambers 102 forms, in its stable state, menisci at the ejection ports 101. When a voltage waveform is applied to the piezoelectric elements 108 in accordance with an ejection signal, the piezoelectric elements 108 deform, which can expand and contract the pressure chambers 102. Combination of the expanding and contracting operation generates droplets 113 from the menisci and ejects ink droplets in a –Z direction.

An amount of ink in the pressure chambers 102 consumed by the ejection operation is supplied from the common liquid chamber 104 by capillary force of the ejection ports 101, and menisci are formed again at the ejection ports 101. Note that, in the present embodiment, a combination of an ejection port 101, a piezoelectric element 108, and a pressure chamber 102 will be referred to as an ejection element.

Specific dimensions of the structure described above will be described. In the present embodiment, ejection elements, that is, the piezoelectric elements 108, the ejection ports 101, and the pressure chambers 102, are arrayed in the Y direction at a density of 150 npi (nozzles per inch). A size of a piezoelectric element 108 is assumed to be approximately 500 μm in an X direction (length) and 110 μm in the Y direction (width), a diameter of an ejection port 101 is assumed to be 25 μm, a thickness of the ejection port 101 is assumed to be 30 μm, and a thickness of a first flow path substrate 105 is assumed to be 100 μm. A size of a pressure chamber 102 is assumed to be 550 μm in the X direction (length), 120 μm in the Y direction (width), and 100 μm in the Z direction (height).

A viscosity of ink to be used is assumed to be 4 cp, and a minimum volume of ink ejected from each ejection port 101 is assumed to be 3 pL.

In the present embodiment, a driving frequency of each piezoelectric element 108 is assumed to be 30 kHz. Such a driving frequency can be set as appropriate based on a time taken in each ejection element to apply voltage to a piezoelectric element 108, actually eject ink, and refill the ejection element with new ink to enable the next ejection operation.

The liquid ejection head is formed with a plurality of arrayed element substrates in each of which a plurality of ejection elements are arrayed. In general, the element substrates are connected to a flexible printed circuit board that is not illustrated and further connected to an electric wiring board that is not illustrated. On the electric wiring board, a power supply terminal for supplying electric power and a signal input terminal for receiving the ejection signal are disposed. The ink supply unit not illustrated is formed with a circulatory flow path not illustrated for supplying ink that is supplied from an ink tank not illustrated and includes coloring material to the individual element substrates and for collecting ink that is not consumed in printing.

With the configuration described above, the ejection elements provided in the element substrate 112 eject ink supplied from the ink supply unit through the ejection ports in the –Z direction using the electric power supplied through the power supply terminal based on print data input through the signal input terminal. Note that dimension values of the components described above are merely an example and may be altered as appropriate in conformance with requirement specification.

Figure 2A:
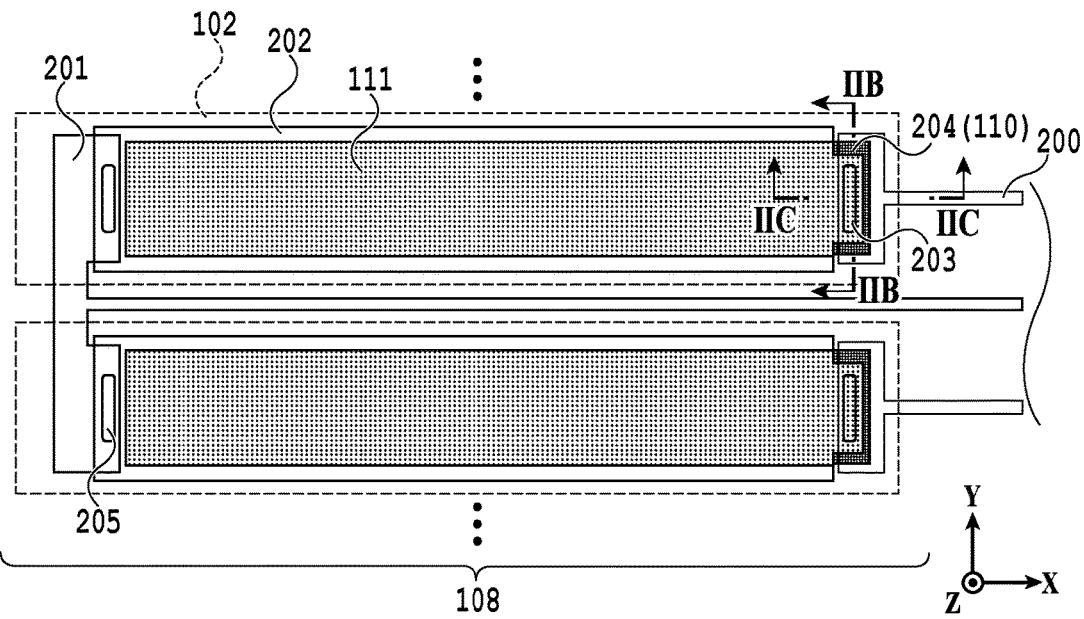
FIG. 2A is a plan view of a piezoelectric element.
Figure 2B:
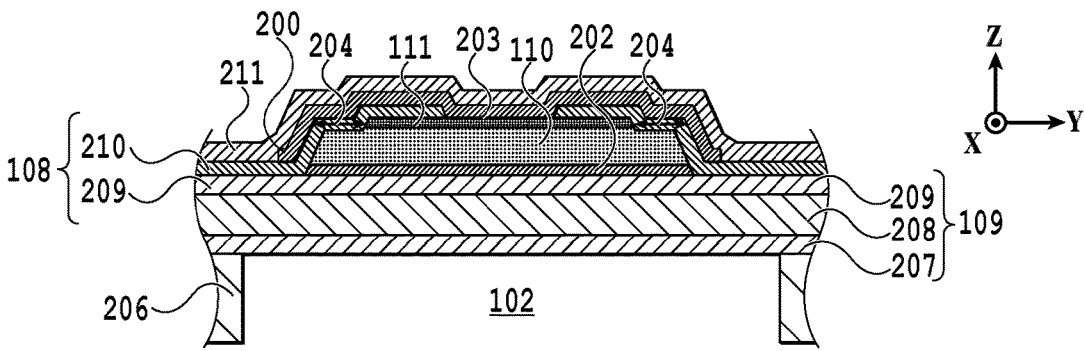
FIG. 2B is a diagram illustrating the piezoelectric element.
Figure 2C:
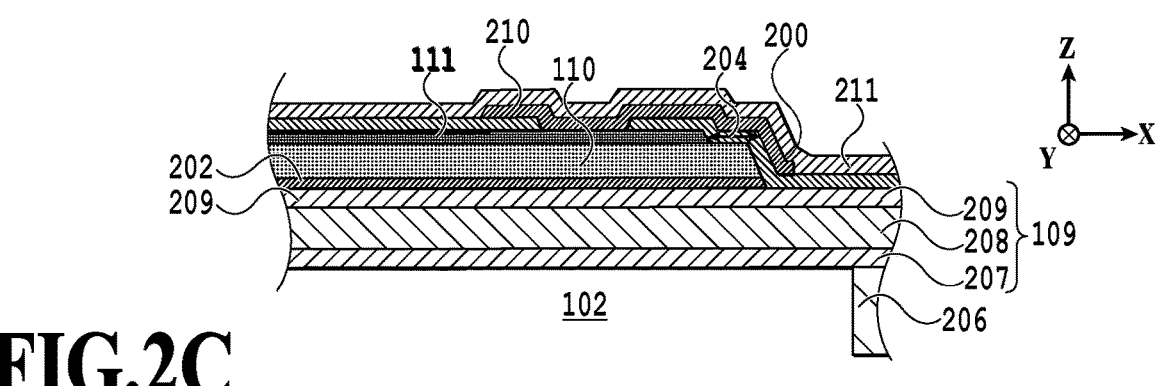
FIG. 2C is a diagram illustrating the piezoelectric element.

FIG. 2A to FIG. 2C are diagrams illustrating the piezoelectric elements 108. FIG. 2A is a plan view, FIG. 2B is a cross-sectional view taken along the line IIb-IIb in FIG. 2A, and FIG. 2C is a cross-sectional view taken along the line IIc-IIc in FIG. 2A. Each pressure chamber 102 is provided with a piezoelectric element 108 that has a thin-film structure and is capable of expanding and contracting an inner volume of the pressure chamber. The piezoelectric element 108 is provided with a wiring electrode 200 (a first wiring electrode) for supplying an actuating signal and a common wiring 201 for applying a common potential. An example of a configuration, material, and dimensions of the piezoelectric element 108 will be described. The piezoelectric element 108 in the present embodiment extends in the X direction that intersects the Y direction.

Dimensions of the piezoelectric element 108 is 500 μm in the X direction (length) and 110 μm in the Y direction (width). The pressure chamber 102 is 110 μm in the Z direction (height). These can be formed by a semiconductor processing technique for micro-electromechanical systems (MEMS).

The pressure chamber 102 and the flow paths can be processed by performing vacuum plasma etching on a single-crystal silicon substrate or anisotropic etching using alkaline solution, or a combination of the vacuum plasma etching and the anisotropic etching. Alternatively, the pressure chamber 102 and the flow paths can be formed by processing the pressure chamber 102, the flow paths, and the piezoelectric element 108 separately using a plurality of silicon substrates, and bonding or adhering the silicon substrates together.

The piezoelectric element 108 formed into a thin film is a unimorph piezoelectric actuator in which a piezoelectric layer 110 is formed on one side of a vibration plate 109. The piezoelectric element 108 is formed facing the pressure chamber 102 and is disposed in a structure in which the piezoelectric element 108 is sealed with the third flow path substrate 107 and the like so as to be kept away from ink. The vibration plate 109 can be selected from among a silicon nitride film, silicon, metal, heat-resistant glass, and the like with consideration given to conditions such as required mechanical characteristics and reliability. The piezoelectric layer 110 can be selected from among a film produced by vacuum sputtering deposition, a layer produced by sol-gel solution deposition, a layer produced by CVD, and the like. In addition, many piezoelectric layers 110 are fired after being formed. The piezoelectric layers 110 are fired at about 600° C. to 800° C. at maximum under an oxygen atmosphere by, for example, lamp annealing heating. In view of coordination in a process flow, a piezoelectric layer 110 may be formed directly on a vibration plate 109 and collectively fired, a piezoelectric layer 110 may be formed on another substrate, fired, and peeled and transferred onto a vibration plate 109 side, or a piezoelectric layer 110 may be formed on another substrate, peeled and transferred onto a vibration plate 109 side, and then collectively formed, for example.

For the electrodes, a noble metal such as Pt and Ir having high heat resistance is preferably selected in the case where the electrodes undergo a sintering process. In the case where the sintering process can be separated, Au, Al, and the like can be selected. As the piezoelectric layer 110, crystal and specific ceramic are known. From the viewpoint of controllability, it is desirable to use a material having a high linearity in response displacement to voltage and drive the piezoelectric layer 110 within a voltage range in which its linearity is high. Note that it is necessary to appropriately take into account effects of saturation characteristics, hysteresis characteristics, nonlinearity, and the like in electrostriction on displacement characteristics.

In the case where an oxide ceramic is used as the piezoelectric layer 110, it may be preferable that an insulation film be formed after a reduction inhibition film is formed on a piezoelectric layer member. As a typical insulation film, a SiO-based insulation film formed by a CVD system is often used. However, there may be a tendency to reduce the oxide on a film-deposition side in the middle of gas reaction. Once the oxide is reduced, a Schottky interface between the piezoelectric layer 110 and a second electrode 111 may be broken, which deteriorates leakage characteristics of the piezoelectric layer 110, thus degrading long-term reliability. To prevent this, it is effective to form an $Al_2O_3$ film, which is widely used in development of ferroelectric random access memory (FRAM®) as one of reduction inhibition films, by an atomic layer deposition (ALD) system.

In the present embodiment, the piezoelectric element 108 has such a configuration in which an SOI substrate including a BOX (Buried OXide) layer being 0.5 μm to 1.5 μm and a device layer being 1.5 μm to 2.5 μm is used as the vibration plate 109, and a first electrode 202 of the piezoelectric element 108 is a Ti/Pt layer. The piezoelectric layer 110 has such a configuration that includes a lead zirconate titanate (PZT) being 1.5 μm to 2.5 μm, a Ti-based alloy as the second electrode 111, an Al-based alloy as the wiring electrode 200, $Al_2O_3$ as the reduction inhibition film, and a silicon oxide film as an insulation film (insulation layer) 210. Then, an outermost layer of the piezoelectric layer 110 is protected by a sealing film 211, which is SiN-based.

As illustrated in FIG. 2B, the piezoelectric element 108 in the present embodiment has such a configuration in which the wiring electrode 200 electrically connected to the second electrode 111 of the piezoelectric layer 110 and the first electrode 202 of the piezoelectric layer 110 do not overlap in a film-thickness direction (the Z direction) at peripheries (end portions) of the piezoelectric element 108. In addition, a second-electrode-absent region 204 is formed in the vicinity of a second electrode contact portion 203 of the piezoelectric layer 110. In the second-electrode-absent region 204, the second electrode 111 is not formed on the piezoelectric layer 110, and the reduction inhibition film and the silicon oxide film are formed as upper layers on the piezoelectric layer 110. The first electrode 202 is connected to the common wiring 201 (a second wiring electrode) via a contact hole 205 (a second contact hole). Lateral surfaces of the piezoelectric layer 110 are inclined surfaces.

As illustrated in FIG. 2B, the pressure chamber 102 is formed by processing a silicon substrate 206 of the SOI substrate. The vibration plate 109 has such a configuration in which a BOX layer 207, a device layer 208, and a thermal oxide film 209 are formed in this order from a pressure chamber 102 side. On an upper surface (in the Z direction) of the vibration plate 109, the first electrode 202, the piezoelectric layer 110, and the second electrode 111 are formed. The second electrode 111 located over the piezoelectric layer 110 is removed at both end portions in the Y direction by a length of 3 to 5 μm, and the removed portions serve as portions of the second-electrode-absent region 204. Providing the second-electrode-absent region 204 to separate the second electrode 111 and side walls of the piezoelectric layer 110 from each other increases distances from the end portions of the second electrode 111 to end portions of the first electrode 202 across the side walls of the piezoelectric layer 110. As a result, a resistance to current that flows from the second electrode 111 to the first electrode 202 through the side walls of the piezoelectric layer 110 increases, and leakage between the wiring electrode 200 and the first electrode 202 via the insulation film 210 can be prevented from occurring.

As an upper layer of the piezoelectric layer 110, the insulation film 210 is formed to cover the piezoelectric layer 110, and in the insulation film 210, the second electrode contact portion 203 is opened. Via the second electrode contact portion 203, the wiring electrode 200 formed as the upper layer of the insulation film 210 and the second electrode 111 are connected together. As a further upper layer of the wiring electrode 200, the sealing film 211 is formed, protecting the piezoelectric element 108.

In the present embodiment, as illustrated in FIG. 2B to 2C, the piezoelectric layer 110 and the first electrode 202 are continuously connected together at circumferential side portions of the piezoelectric layer 110 in a region where the piezoelectric layer 110 and the wiring electrode 200 overlap in the Z direction. In other words, a surface forming an external shape of the piezoelectric layer 110 at a side portion of the piezoelectric layer 110 and a surface forming an external shape of the first electrode 202 at a side portion of the first electrode 202 are a continuous surface. In addition, the piezoelectric layer 110 and the first electrode 202 are formed such that at least portions of peripheries of the piezoelectric layer 110 and the first electrode overlap in the region where the piezoelectric layer 110 and the wiring electrode 200 overlap in plan view of the piezoelectric layer 110. Such formation reduces a region where the wiring electrode 200 and the first electrode 202 overlap and reduces a region where the wiring electrode 200 and the first electrode 202 are close to each other across the insulation film 210 in the thickness direction of the piezoelectric layer 110 (the Z direction). This can prevent or reduce the occurrence of the leakage between the wiring electrode 200 and the first electrode 202 via the insulation film 210. This provides a long-term reliability of the apparatus.

As illustrated in FIG. 2C, also at a periphery of the piezoelectric layer 110 in the X direction, a side wall surface of the piezoelectric layer 110 and a side wall surface of the first electrode 202 have shapes that are continuously connected together. This reduces regions where the wiring electrode 200 and the first electrode 202 are close to each other across the insulation film 210 at the peripheries of the piezoelectric layer 110. With this configuration, it is possible to prevent or reduce the occurrence of the leakage between the wiring electrode 200 and the first electrode 202.

With the configuration described above, an element substrate from which a pressure chamber portion corresponding to each piezoelectric element was removed by etching was fabricated and subjected to an endurance test described below. In a thermostat, a high DC voltage of several tens of volts was applied between the first electrode and the second electrode 111 of the piezoelectric element 108 in a high-temperature, high-humidity atmosphere. As a result, at a time point after a lapse of 200 hours, there was no dielectric breakdown caused in the vicinity of the second electrode contact portion.

FIG. 3A to FIG. 3F are cross-sectional views taken along the line IIb-IIb in FIG. 2A, being diagrams illustrating a manufacturing process of the piezoelectric element 108 in a sequential order of steps. The manufacturing process of the piezoelectric element 108 will be described below in the sequential order of steps. FIG. 3A is a diagram illustrating a step of forming the piezoelectric layer 110. An SOI substrate that is to serve as a vibration plate and includes the device layer 208 (a thickness of 2 μm to 2.5 μm) and a BOX layer 207 (a thickness of 0.8 μm to 1.2 μm) is prepared. The device layer 208 is subjected to thermal oxidation to form the thermal oxide film 209 having a thickness of about 500 nm, and thus the thickness of the device layer 208 becomes about 1.75 μm to 2.25 μm. On a surface of the thermal oxide film 209, by vacuum sputtering, Ti is deposited to have a thickness of several nanometers, and then Pt is deposited to have a thickness of 100 nm to 200 nm, as the first electrode 202. Next, PZT was formed as the piezoelectric layer 110 by a sol-gel process. An initial seed layer is coated and fired, and a main layer being about 200 nm is repeatedly coated and fired at 700° C. Thus, the PZT having a thickness of 1.5 μm to 2.5 μm in total is formed. Afterward, a Ti-based alloy film is formed as the second electrode 111.

FIG. 3B is a diagram illustrating a step of forming the piezoelectric element 108 by photolithography processing. A resist pattern 300 corresponding to the piezoelectric element 108 is formed, and dry etching processing with high-density plasma from a chlorine-based gas is performed to remove the second electrode 111 and the piezoelectric layer 110 in a region that is not protected by the resist. Then, it is necessary to leave a portion of the first electrode 202 to be exposed in an over-etching process in which the piezoelectric layer 110 is completely removed finally. To ensure a selectivity between the piezoelectric layer 110 and the first electrode 202, an etching gas is switched in a stage close to the end of the etching so that an etching rate of the first electrode 202 is decreased relatively to the piezoelectric layer 110. In this manner, the first electrode 202 in the region not protected by the resist can be exposed without etching. It is thus possible to ensure electrical contact with the first electrode 202. Afterward, plasma ashing and organic stripping solution cleaning are performed to remove the resist pattern 300.

FIG. 3C is a diagram illustrating a step of forming the first electrode 202 and the second electrode 111. A resist pattern 300 that corresponds to the second electrode 111 and is other than the resist pattern 300 in FIG. 3B is formed, and exposure is performed with high shape accuracy. Note that the resist 300 is formed to be wider than the end portions (peripheries) of the piezoelectric element by several micrometers or more, with consideration given to misalignment in the exposure. By performing the etching on the first electrode 202 in this manner, it is possible to implement a configuration in which the first electrode 202 is not disposed as a lower layer of the wiring electrode 200 and the insulation film 210 that are formed in a back-end process. Furthermore, by performing the etching in the formation of the second electrode 111 in the state where a periphery of the second electrode 111 is exposed, portions of the second electrode 111 at positions that do not overlap the resist 300 on the piezoelectric layer 110 in plan view from a vertical direction are removed, and thus the second-electrode-absent region 204 is formed.

In the case where a material of the first electrode 202 is noble-metal-based, a sputtering effect, which is a physical effect, is dominant in the etching of the first electrode 202, and pieces of the first electrode 202 separated by the etching may reattach to a side wall of the piezoelectric layer 110. This may cause degradation in insulation performance between the first electrode and the second electrode 111 from the side wall of the piezoelectric layer 110. To prevent or reduce this, the periphery of the second electrode 111 is made exposed by a dimension greater than or equal to a layer thickness of the piezoelectric layer 110 (3 μm to 5 μm in the present embodiment) in a region where the wiring electrode 200 and the piezoelectric layer 110 overlap in plan view from the vertical direction. Then, it is more preferable to remove the periphery of the second electrode 111 so as not to decrease the insulation performance between the first electrode 202 and the second electrode 111. As described above, although no electric field is applied to the removed portions of the second electrode 111, this will have substantially no effect on displacement performance because the portions are several micrometers at the end portions of the piezoelectric layer 110.

FIG. 3D is a diagram illustrating a step of forming the insulation film 210 and the second electrode contact portion 203. After an ALD-Al₂O₃ film not illustrated is formed, the insulation film 210 is formed to be about 300 to 600 nm, and the second electrode contact portion (a first contact hole) 203 for bringing electrical connection with the wiring electrode 200 to the second electrode 111 is formed by photolithography processing. In addition, the contact hole 205 for bringing electrical connection with the first electrode 202 (see FIG. 2A) is also formed here. The second electrode contact portion 203 and the contact hole 205 may be formed at the same time in view of an effect caused by photolithography due to a film thickness step or may be formed separately.

FIG. 3E is a diagram illustrating a step of forming the wiring electrode 200. The wiring electrode 200 is formed by performing sputtering to form the wiring electrode 200 being an Al-based alloy, which is then subjected to photolithography processing. In the present embodiment, the wiring electrode 200 to each element is connected to the second electrode 111 of the element. To the first electrode 202, the common wiring 201 common to another piezoelectric element (see FIG. 2A) is connected. The wiring electrode 200 and the common wiring 201 are extended to pad regions, serving as pad electrodes.

FIG. 3F is a diagram illustrating a step of forming the sealing film 211. By CVD, a SiN film is formed to be about 200 nm to 400 nm, thus serving as the sealing film 211. Here, the sealing film 211 is opened at a pad portion, and the pad portion for electrification to a control circuit board via bonding wires, an anisotropic conductive film (ACF), or the like is formed. Thus, the piezoelectric element 108 is formed.

Subsequently, the silicon substrate 206 is subjected to photolithography processing from a back-surface side in a region where the piezoelectric layer 110 is formed, and the pressure chamber 102 and the flow paths are formed (see FIG. 1B and FIG. 2A) by Si deep etching with ICP plasma. Finally, the first flow path substrate 105, the second flow path substrate 106, and the third flow path substrate 107 are bonded together with bonding adhesive. Thereby, the element substrate 112 including the piezoelectric element according to the present disclosure is completed.

Afterward, required electrical implementation is performed, and a module to serve as an ink supply part and the element substrate 112 are bonded together. Thereby, a liquid ejection head is formed.

Comparative Example

FIG. 4A through FIG. 4C are diagrams illustrating a typical piezoelectric element 408 as a comparative example.

FIG. 4A is a plan view, FIG. 4B is a cross-sectional view taken along the line IVb-IVb in FIG. 4A, and FIG. 4C is a cross-sectional view taken along the line IVc-IVc in FIG. 4A. The comparative example has a region 400, where a wiring electrode 410 electrically connected to a second electrode 411 of the piezoelectric element 408 overlaps, via an insulation film 420 as a wiring foundation, a first electrode 402 located as a further lower layer. The region 400 of the overlap is present in the vicinity of a periphery of a short side of the piezoelectric element.

An electric resistance of the insulation film 420 as a common insulation film is ten times higher than or as high as an electric resistance of a piezoelectric layer member 430. Therefore, the insulation film 420 does not reach dielectric breakdown earlier under normal conditions. However, in a region where the piezoelectric layer member 430 repeatedly deforms, the insulation film 420 may fail to stand a deformation amount, and a minute crack may be formed in the insulation film 420. In such circumstances, when a crack path is formed between the first electrode 402 and the second electrode 411, a probability of dielectric breakdown rapidly increases. Once the dielectric breakdown occurs, the failure may propagate to elements in the vicinity.

In addition, in a layer formation initial layer of the piezoelectric layer member 430, atomic diffusion due to a high-temperature annealing process of the piezoelectric film member 430 occurs. Therefore, compounds having compositions that are shifted from a stoichiometric ratio are formed. For this reason, in a step of forming a pattern of the piezoelectric layer member 430 corresponding to each nozzle, etching removal may be performed unstably. If the unstable etching removal occurs particularly at a portion in the vicinity of a pattern of the piezoelectric layer member 430, etching residues of the piezoelectric layer member 430 are left on the first electrode 402, and the insulation film 420 is further formed on the etching residues, and the wiring electrode 410 is further formed on the insulation film 420. When the etching residues are left, coverage by insulation film 420 is imperfect, which serves as a cause of leakage between the first electrode 402 and the second electrode 411.

Furthermore, if a shape of a side wall of the piezoelectric layer member 430 has a discontinuous shape, the insulation film 420 formed as an upper layer of the piezoelectric layer member 430 fails to fully cover the shape, and a poor coverage is likely to occur. In the case where a durability of the insulation film 420 is degraded by repetitive deformation of the piezoelectric layer member 430, the wiring electrode 410 may cause a leakage from a portion of the degraded durability as a starting point, through a conductive path formed on a side wall of the piezoelectric layer member 430, to the first electrode 402 exposed at a periphery of the piezoelectric layer member 430.

As described above, in the comparative example for which no measures are taken, there is a plurality of possible leakage paths, increasing a probability of reaching dielectric breakdown in contrast to the first embodiment.

Initial characteristics were measured on the configuration of the comparative example. A leakage current at 30 V was 20% to 30% lower. A possible leakage path is one of the leakage paths described above or a combination of the leakage paths. In addition, an element substrate from which a liquid chamber portion corresponding to each piezoelectric element was removed by etching was subjected to an endurance test as in the first embodiment. In a thermostat, a high DC voltage of several tens of volts was applied between the first electrode 402 and the second electrode 411 of the piezoelectric element 408 in a high-temperature, high-humidity atmosphere. At time points after a lapse of 50 to 100 hours, a failure regarded as dielectric breakdown that was caused in the vicinity of an upper electrode contact portion 403 occurred in some cases.

No such a breakage occurred in the configuration described in the first embodiment. Therefore, it can be inferred that the present disclosure effectively works in the first embodiment.

Modification

Figure 5:
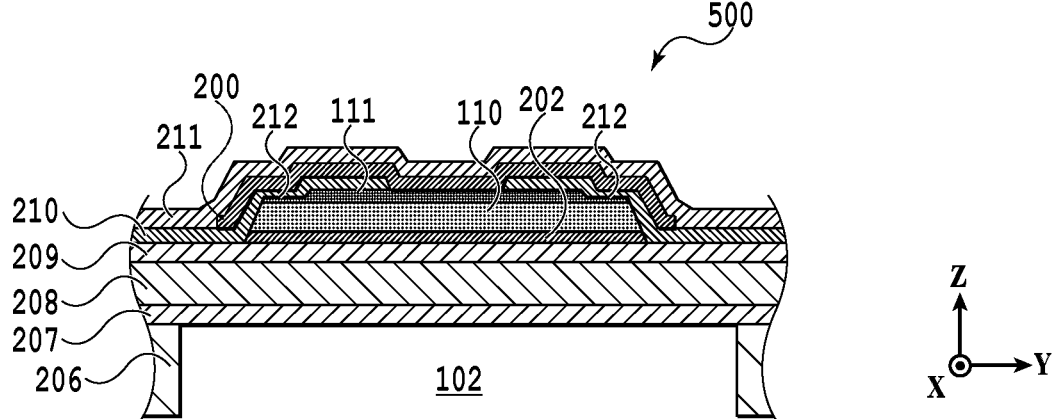
FIG. 5 is a cross-sectional view illustrating a pressure element in a modification.

FIG. 5 is a cross-sectional view illustrating a pressure element 500 in a modification of the present embodiment. In the present modification, a portion that is described as the second-electrode-absent region 204 (see FIG. 2B) in the first embodiment is replaced with a second-electrode-thin region 212. In other words, in the second-electrode-thin region 212, a second electrode 111 is formed to have a thickness thinner than in a region other than a periphery of the second electrode 111. By making a circumferential end portion of the second electrode 111 thinner than in a region other than the circumferential end portion in this manner, an electrical resistance of the electrode is increased. Therefore, an effect similar to that provided by the configuration described in the first embodiment can be provided. In addition, in the configuration in the present modification, an electric field is applied to a portion in the vicinity of the piezoelectric layer 110. Therefore, an amount of displacement of the piezoelectric layer 110 does not decrease.

In this manner, the configuration is made such that the periphery of the first electrode 202 and the periphery of the piezoelectric layer 110 overlap in the region where the piezoelectric layer 110 and the wiring electrode 200 overlap in plan view of the piezoelectric layer 110. It is thus possible to provide a piezoelectric element, a liquid ejection head, and a liquid ejection apparatus of which a long-term reliability can be improved.

Second Embodiment

A second embodiment of the present disclosure will be described below with reference to the drawings. Note that a basic configuration in the present embodiment is similar to that in the first embodiment. Therefore, the following description will be given of a characteristic configuration.

FIG. 6A and FIG. 6B are diagrams illustrating a piezoelectric element 108 in the present embodiment. FIG. 6A is a plan view, and FIG. 6B is a cross-sectional view taken along the line VIb-VIb in FIG. 6A. In the present embodiment, a width in a Y direction of a wiring electrode 200 electrically connected to a second electrode 111 of the piezoelectric element 108 is narrower than a width of a short side of a piezoelectric layer 110. As a result, a region of the wiring electrode 200 disposed on a side wall surface of the piezoelectric layer 110 is reduced compared with the configuration in the first embodiment.

If discontinuous unevenness is present on a side wall surface of the piezoelectric layer 110, a coverage failure of an insulation film 210 is likely to occur. For this reason, by making the width of the wiring electrode 200 shorter than the width of the short side of the piezoelectric layer 110, a region of the wiring electrode 200 overlapping the side wall surface of the piezoelectric layer 110 is reduced. This can further prevent or reduce the occurrence of leakage between the wiring electrode 200 and the piezoelectric layer 110.

With the configuration described above, an element substrate from which a liquid chamber portion corresponding to each piezoelectric element was removed by etching was fabricated and subjected to an endurance test as in the first embodiment. In a thermostat, a high DC voltage of several tens of volts was applied between a first electrode 202 and the second electrode 111 of the piezoelectric element 108 in a high-temperature, high-humidity atmosphere. At a time point after a lapse of 200 hours, there was no dielectric breakdown caused in the vicinity of the second electrode contact portion.

Third Embodiment

A third embodiment of the present disclosure will be described below with reference to the drawings. Note that a basic configuration in the present embodiment is similar to that in the first embodiment. Therefore, the following description will be given of a characteristic configuration.

Figure 7:
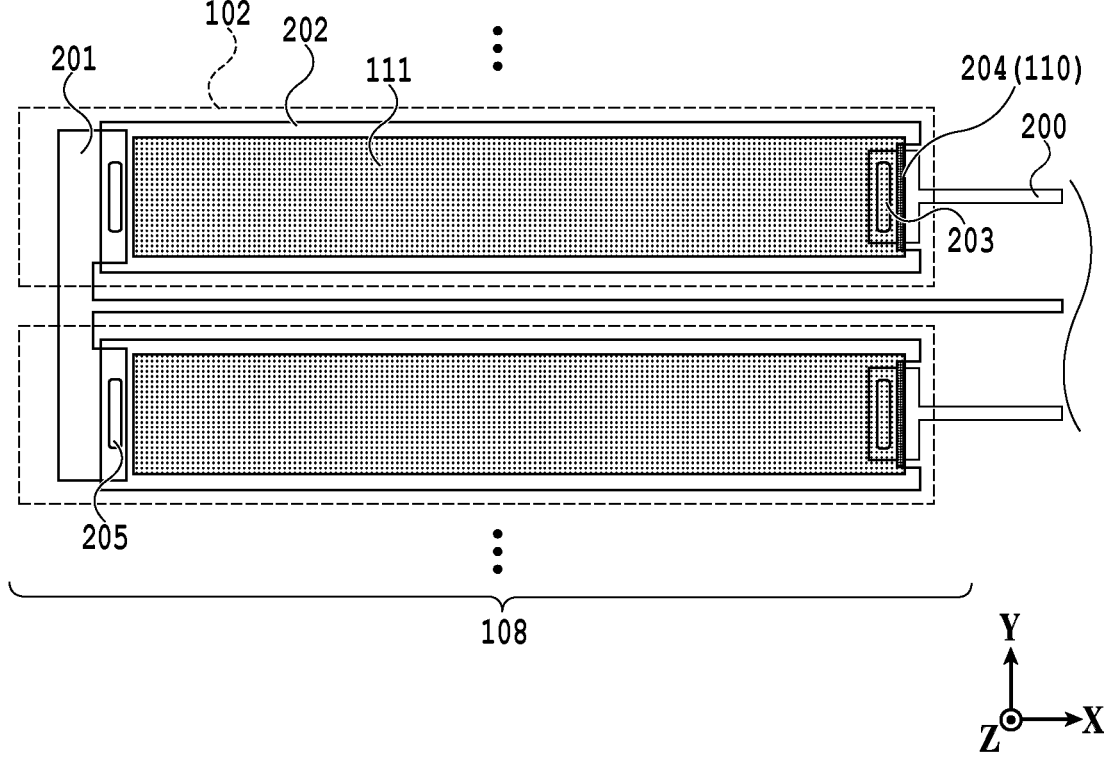
FIG. 7 is a plan view of a piezoelectric element.

FIG. 7 is a plan view of a piezoelectric element 108 in the present embodiment. In the present embodiment, as in the second embodiment, a width of a wiring electrode 200 electrically connected to a second electrode 111 of the piezoelectric element 108 is shorter than a width of a short side of a piezoelectric layer 110. In addition, regions where a first electrode 202 and the piezoelectric layer 110 are etched are reduced. This makes it possible to further reduce a region where no electric field is applied to the piezoelectric layer 110 while preventing or reducing leakage between the wiring electrode 200 and the piezoelectric layer 110 and to reduce a region (loss) that does not contribute to a displacement of a vibration plate.

Note that, in the present embodiment, the second electrode 111 has a width in a Y direction that is larger than or equal to a width of the piezoelectric layer 110.

A removal length of the second electrode 111 is preferably set such that an area of the piezoelectric layer 110 to which no electric field is applied is about 1% of a total area of the piezoelectric layer 110. The removal length is about 3 to 5 μm in the present embodiment. When the area of the piezoelectric layer 110 to which no electric field is applied is about 1% of the total area, a displacement loss of the piezoelectric element can be sufficiently confined within a tolerable range while an advantage of improvement in voltage proof is provided.

With the configuration described above, an element substrate from which a liquid chamber portion corresponding to each piezoelectric element was removed by etching was fabricated and subjected to an endurance test as in the first embodiment. In a thermostat, a high DC voltage of several tens of volts was applied between the first electrode 202 and the second electrode 111 of the piezoelectric element 108 in a high-temperature, high-humidity atmosphere. At a time point after a lapse of 200 hours, there was no dielectric breakdown caused in the vicinity of the second electrode contact portion.

Fourth Embodiment

A fourth embodiment of the present disclosure will be described below with reference to the drawings. Note that a basic configuration in the present embodiment is similar to that in the first embodiment. Therefore, the following description will be given of a characteristic configuration.

Figure 8:
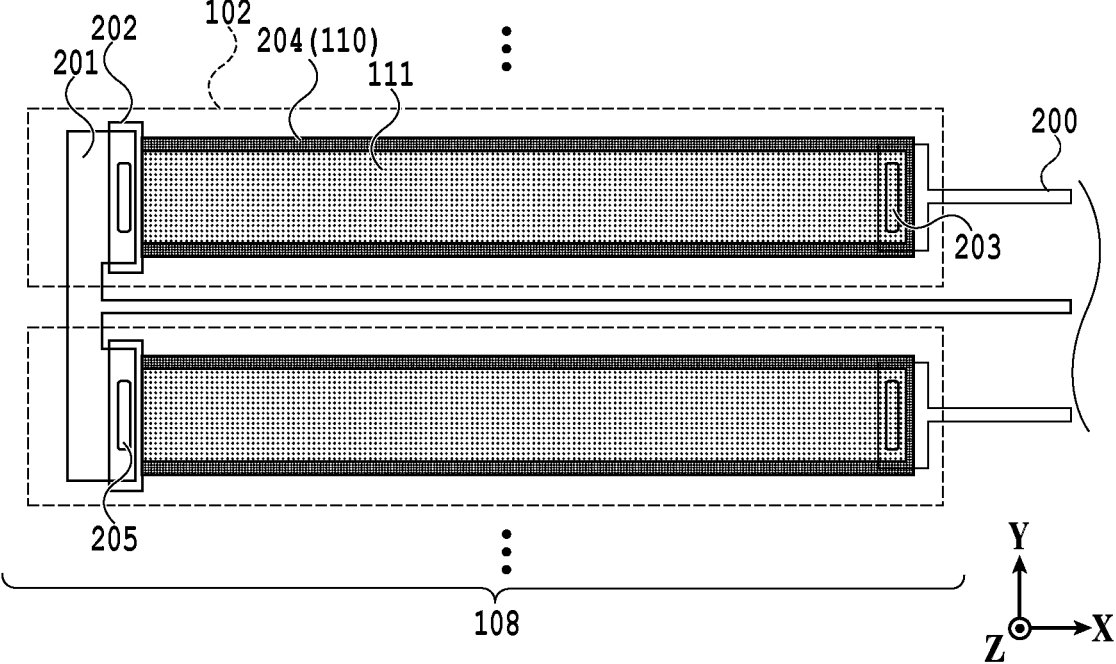
FIG. 8 is a plan view of a piezoelectric element.

FIG. 8 is a plan view of a piezoelectric element 108 in the present embodiment. In the present embodiment, as in the second embodiment, a width in a Y direction of a wiring electrode 200 electrically connected to a second electrode 111 of the piezoelectric element 108 is shorter than a width of a short side of a piezoelectric layer 110. Furthermore, the present embodiment has a configuration in which an edge surface of a first electrode 202 and an edge surface of the piezoelectric layer 110 match along the substantially (about 92%) entire circumference of the piezoelectric layer 110. In addition, the periphery of the second electrode 111 is positioned inner than a boundary of the piezoelectric layer 110 by about 5 μm in a Y direction. In the case of this configuration, an area of the piezoelectric layer 110 to which no electric field is applied is about 12% of a total area of the piezoelectric layer 110. At this time, the configuration is such that no electric field is applied to a portion in the vicinity of the piezoelectric layer 110, and a decrease in displacement of about 15% was recognized.

In plan view of the piezoelectric element 108, many portions in the vicinity of the second electrode 111 are located in a region of the piezoelectric layer 110. Therefore, an electrification amount between the second electrode 111 and the first electrode 202 via a side wall portion of the piezoelectric layer 110 is significantly reduced. In addition, not allowing exposure of the first electrode 202, where etching residues are likely to be left, as much as possible as viewed from above is preferable because a probability of occurrence of a failure in sealing can be reduced. A failure in sealing tends to cause peeling of a sealing film.

The configuration in the present embodiment enables a design for increasing reliability when adopted in the case where a displacement capability of a piezoelectric element has a margin with respect to requirement specifications.

With the configuration described above, an element substrate from which a liquid chamber portion corresponding to each piezoelectric element was removed by etching was fabricated and subjected to an endurance test as in the first embodiment. In a thermostat, a high DC voltage of several tens of volts was applied between the first electrode and the second electrode of the piezoelectric element 108 in a high-temperature, high-humidity atmosphere. At a time point after a lapse of 200 hours, there was no dielectric breakdown caused in the vicinity of the second electrode contact portion.

Fifth Embodiment

A fifth embodiment of the present disclosure will be described below with reference to the drawings. Note that a basic configuration in the present embodiment is similar to that in the first embodiment. Therefore, the following description will be given of a characteristic configuration.

Figure 9:
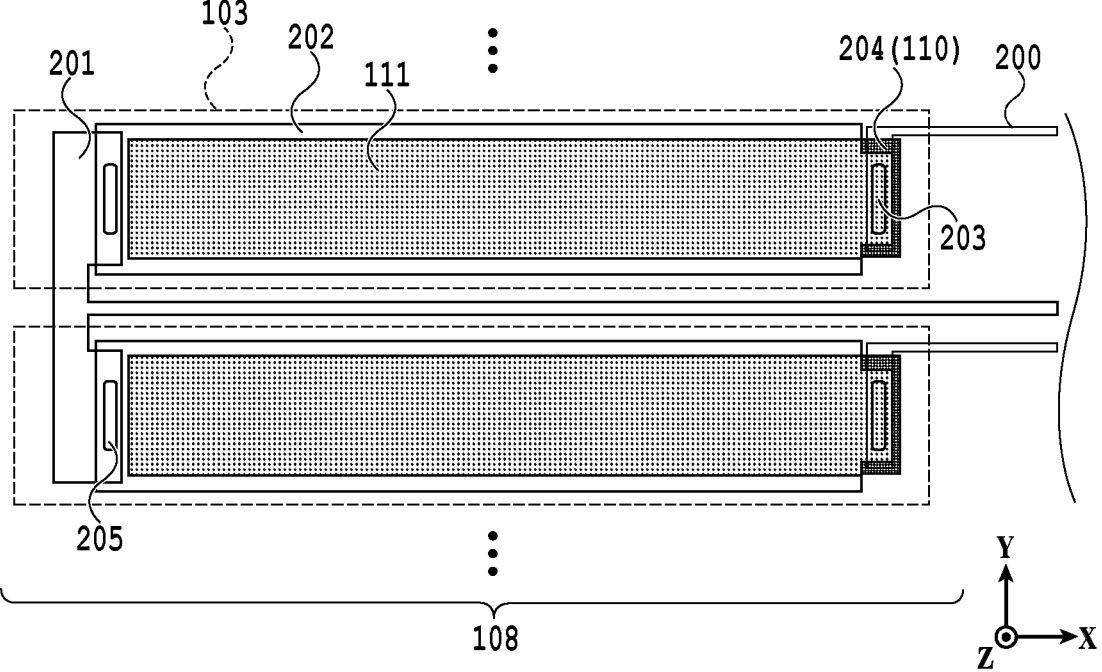
FIG. 9 is a plan view of a piezoelectric element.

FIG. 9 is a plan view of a piezoelectric element 108 in the present embodiment. In the present embodiment, a path in a wiring electrode 200 reaching a second electrode contact portion 203 differs. The wiring electrode 200 reaches the second electrode contact portion 203 from a long side of the piezoelectric element. Therefore, a region where the wiring electrode 200 and a side wall portion of a piezoelectric layer 110 overlap is the smallest among the embodiments described above. With the configuration in the present embodiment, the occurrence of leakage between the wiring electrode 200 and the first electrode 202 via the side wall portion of the piezoelectric layer 110 can be further prevented or reduced.

With the configuration described above, an element substrate from which a liquid chamber portion corresponding to each piezoelectric element was removed by etching was fabricated and subjected to an endurance test as in the first embodiment. In a thermostat, a high DC voltage of several tens of volts was applied between the first electrode 202 and the second electrode 111 of the piezoelectric element 108 in a high-temperature, high-humidity atmosphere. At a time point after a lapse of 200 hours, there was no dielectric breakdown caused in the vicinity of the second electrode contact portion.

A plurality of embodiments have been described. Components in the embodiments may be combined to the extent practicable as appropriate. In this case, it is desirable to make a suitable design with consideration given to a required displacement performance and a reliability (leakage resistance).

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2022-199691 filed Dec. 14, 2022, which is hereby incorporated by reference wherein in its entirety.

What is claimed is:

1. A piezoelectric element comprising:
a first electrode provided on a substrate;
a piezoelectric layer provided stacked on the first electrode;
a second electrode provided stacked on the piezoelectric layer;
an insulation layer provided in such a manner as to cover at least portions of the piezoelectric layer and the second electrode; and
a first wiring electrode provided in such a manner as to cover at least a portion of the insulation layer and is electrically connected to the second electrode via a first contact hole, wherein,
in plan view of the piezoelectric layer,
a periphery of the first electrode and a periphery of the piezoelectric layer overlap in a region where the piezoelectric layer and the first wiring electrode overlap,
at least a portion of a periphery of the second electrode is positioned in a region of the piezoelectric layer, and
at least a portion of the periphery of the second electrode has a thickness that is thinner than a thickness in a region of the second electrode other than the periphery of the second electrode.

2. A piezoelectric element comprising:
a first electrode provided on a substrate;
a piezoelectric layer provided stacked on the first electrode;
a second electrode provided stacked on the piezoelectric layer;
an insulation layer provided in such a manner as to cover at least portions of the piezoelectric layer and the second electrode; and
a first wiring electrode provided in such a manner as to cover at least a portion of the insulation layer and is electrically connected to the second electrode via a first contact hole, wherein,
in plan view of the piezoelectric layer,
a periphery of the first electrode and a periphery of the piezoelectric layer overlap in a region where the piezoelectric layer and the first wiring electrode overlap,
at least a portion of a periphery of the second electrode is positioned in a region of the piezoelectric layer,
the first electrode is electrically connected to a second wiring electrode via a second contact hole, and
when a first direction is defined as a direction from the first contact hole toward the second contact hole, the second electrode is provided such that both end portions of the second electrode are positioned in the region of the piezoelectric layer in a second direction that intersects the first direction.

3. The piezoelectric element according to claim 2, wherein a width of the first wiring electrode in the second direction is narrower than a width of the piezoelectric layer in the second direction.

4. The piezoelectric element according to claim 3, wherein the first wiring electrode includes a path configured to transmit electricity at an end portion of the first wiring electrode in the second direction.

5. A piezoelectric element comprising:
a first electrode provided on a substrate;
a piezoelectric layer provided stacked on the first electrode;
a second electrode provided stacked on the piezoelectric layer;
an insulation layer provided in such a manner as to cover at least portions of the piezoelectric layer and the second electrode; and
a first wiring electrode provided in such a manner as to cover at least a portion of the insulation layer and is electrically connected to the second electrode via a first contact hole, wherein
the first electrode is electrically connected to a second wiring electrode via a second contact hole, and
in plan view of the piezoelectric layer,
a periphery of the first electrode and a periphery of the piezoelectric layer overlap in a region where the piezoelectric layer and the first wiring electrode overlap,
at least a portion of a periphery of the second electrode is positioned in a region of the piezoelectric layer,
when a first direction is defined as a direction from the first contact hole toward the second contact hole, at least portions of the peripheries of the first electrode and the piezoelectric layer overlap in the first direction in a region where the piezoelectric layer overlaps the first wiring electrode in a thickness direction of the piezoelectric layer, and
the first wiring electrode extends in a second direction intersecting the first direction in a region where the first electrode and the piezoelectric layer overlap at the peripheries of the first electrode and the piezoelectric layer.

6. The piezoelectric element according to claim 5, wherein a width of the second electrode in the second direction has a dimension that is larger than or equal to a width of the piezoelectric layer in the second direction.

7. A liquid ejection head comprising:
a piezoelectric element having:
a first electrode provided on a substrate,
a piezoelectric layer provided stacked on the first electrode,
a second electrode provided stacked on the piezoelectric layer,
an insulation layer provided in such a manner as to cover at least portions of the piezoelectric layer and the second electrode, and
a first wiring electrode provided in such a manner as to cover at least a portion of the insulation layer and is electrically connected to the second electrode via a first contact hole, wherein,
in plan view of the piezoelectric layer,
a periphery of the first electrode and a periphery of the piezoelectric layer overlap in a region where the piezoelectric layer and the first wiring electrode overlap, at least a portion of a periphery of the second electrode is positioned in a region of the piezoelectric layer, and at least a portion of the periphery of the second electrode has a thickness that is thinner than a thickness in a region of the second electrode other than the periphery of the second electrode.

8. A liquid ejection apparatus equipped with a liquid ejection head, the liquid ejection head comprising:

a piezoelectric element having:

a first electrode provided on a substrate, a piezoelectric layer provided stacked on the first electrode, a second electrode provided stacked on the piezoelectric layer, an insulation layer provided in such a manner as to cover at least portions of the piezoelectric layer and the second electrode, and a first wiring electrode provided in such a manner as to cover at least a portion of the insulation layer and is electrically connected to the second electrode via a first contact hole, wherein, in plan view of the piezoelectric layer, a periphery of the first electrode and a periphery of the piezoelectric layer overlap in a region where the piezoelectric layer and the first wiring electrode overlap, at least a portion of a periphery of the second electrode is positioned in a region of the piezoelectric layer, and at least a portion of the periphery of the second electrode has a thickness that is thinner than a thickness in a region of the second electrode other than the periphery of the second electrode.

\* \* \* \* \*